United States Patent
Kester et al.

(10) Patent No.: US 9,580,805 B2
(45) Date of Patent: *Feb. 28, 2017

(54) VAPOR DEPOSITION SYSTEM AND METHOD

(71) Applicant: QUANTUM INNOVATIONS, INC., Central Point, OR (US)

(72) Inventors: Norman L Kester, Rogue River, OR (US); Cliff J. Leidecker, Rogue River, OR (US)

(73) Assignee: QUANTUM INNOVATIONS, INC., Central Point, OR (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/135,893

(22) Filed: Apr. 22, 2016

(65) Prior Publication Data

US 2016/0237562 A1 Aug. 18, 2016

Related U.S. Application Data

(62) Division of application No. 13/653,352, filed on Oct. 16, 2012.

(51) Int. Cl.
| | | |
|---|---|---|
| C23C 16/00 | (2006.01) | |
| C23C 16/458 | (2006.01) | |
| C23C 14/56 | (2006.01) | |
| C23C 14/50 | (2006.01) | |

(52) U.S. Cl.
CPC ............ *C23C 16/458* (2013.01); *C23C 14/50* (2013.01); *C23C 14/568* (2013.01)

(58) Field of Classification Search
CPC ........ C23C 16/45551; C23C 16/45548; C23C 16/45544

USPC ....................................................... 427/248.1
See application file for complete search history.

(56) References Cited

U.S. PATENT DOCUMENTS

| | | | | |
|---|---|---|---|---|
| 4,008,683 | A | * | 2/1977 | Rose ....................... H01J 37/18 118/50.1 |
| 4,237,183 | A | | 12/1980 | Fujiwara et al. |
| 4,485,759 | A | | 12/1984 | Brandolf |
| 4,663,009 | A | * | 5/1987 | Bloomquist ............ C23C 14/14 204/192.15 |
| 4,981,408 | A | | 1/1991 | Hughes |
| 5,026,469 | A | | 6/1991 | Kunkel et al. |
| 5,370,737 | A | | 12/1994 | Mathis |
| 6,090,444 | A | | 7/2000 | Wixon et al. |
| 6,251,551 | B1 | * | 6/200 | Kunze-Concewitz H01L 21/67715 430/22 |
| 6,294,227 | B1 | | 9/2001 | Anma et al. |

(Continued)

FOREIGN PATENT DOCUMENTS

DE 19836652 2/2000

*Primary Examiner* — Kelly M Gambetta
(74) *Attorney, Agent, or Firm* — Jerry Haynes Law (57) ABSTRACT

A deposition system includes a system housing having a housing interior, a fixture transfer assembly having a generally sloped fixture transfer rail extending through the housing interior, a plurality of processing chambers connected by the fixture transfer rail, a controller interfacing with the processing chambers and at least one fixture carrier assembly carried by the fixture transfer rail and adapted to contain one substrate. The fixture carrier assembly travels along the fixture transfer rail under influence of gravity. A deposition method is also disclosed.

20 Claims, 6 Drawing Sheets

(56) References Cited

U.S. PATENT DOCUMENTS

| | | | |
|---|---|---|---|
| 6,817,712 B2 | 11/2004 | Hayashi | |
| 7,014,664 B2 | 3/2006 | Inzuka | |
| 9,394,605 B1 * | 7/2016 | Kester | C23C 14/568 |
| 2001/0015074 A1 | 8/2001 | Hosokawa | |
| 2003/0190223 A1 | 10/2003 | Peiter | |
| 2005/0019504 A1 * | 1/2005 | Bi | C23C 16/401 |
| | | | 427/596 |
| 2006/0049044 A1 | 3/2006 | Seddon | |
| 2006/0102078 A1 | 5/2006 | Fairbairn et al. | |
| 2007/0197681 A1 | 8/2007 | Lowery et al. | |
| 2008/0220264 A1 | 9/2008 | Iyer et al. | |
| 2009/0169766 A1 | 7/2009 | Takahashi et al. | |
| 2009/0234450 A1 | 9/2009 | Lowery et al. | |
| 2009/0320755 A1 | 12/2009 | Liu et al. | |
| 2010/0040801 A1 | 2/2010 | Mitsuishi et al. | |
| 2010/0102025 A1 | 4/2010 | Eagerton | |
| 2010/0137984 A1 | 6/2010 | Lowery et al. | |
| 2010/0162955 A1 | 7/2010 | Lei et al. | |
| 2010/0313809 A1 | 12/2010 | Guo et al. | |

\* cited by examiner

VAPOR DEPOSITION SYSTEM AND METHOD

CROSS-REFERENCE TO RELATED APPLICATIONS

This application is a divisional of application Ser. No. 13/653,352, filed Oct. 16, 2012 and entitled VAPOR DEPOSITION SYSTEM AND METHOD, which application is incorporated by reference herein in its entirety and claims the benefit of U.S. provisional patent application No. 61/613,366, filed Mar. 20, 2012 and entitled VAPOR DEPOSITION SYSTEM AND METHOD, which application is incorporated by reference herein in its entirety; and this application is a continuation in part of U.S. Ser. No. 13/030, 091, filed on Feb. 17, 2011 entitled "VAPOR DEPOSITION SYSTEM AND METHOD, which in turn claims the benefit of U.S. provisional application No. 61/338,949, filed Feb. 26, 2010 and entitled "FIXTURE TO SUSPEND OPHTHALMIC LENSES FOR CONCAVE AND CONVEX SIDE APPLICATIONS; U.S. provisional application No. 61/338,951, filed Feb. 26, 2010 and entitled "FIXTURE DEVICE FOR THE APPLICATION OF VAPOR DEPOSITION ON THE CONCAVE AND CONVEX SIDES OF AN OPHTHALMIC LENS WHILE ROTATING"; U.S. provisional application No. 61/343,668, filed May 3, 2010 and entitled "GRAVITY FED TRANSFER MECHANISM"; U.S. provisional application No. 61/343,669, filed May 3, 2010 and entitled "HYDROPHOBIC, OLEOPHOBIC OR SUPER HYDROPHOBIC APPLICATOR"; and U.S. provisional application No. 61/343,672, filed May 3, 2010 and entitled "FULLY AUTOMATED, IN-LINE, HIGH THROUGHPUT, LOW VOLUME, SIMULTANEOUS AND NON-SIMULTANEOUS PROCESS, HIGH AND LOW VACUUM, PHYSICAL VAPOR DEPOSITION SYSTEM, each of which applications is incorporated by reference herein in its entirety.

FIELD OF THE INVENTION

The disclosure generally relates to coatings for optical lenses and other substrates. More particularly, the disclosure relates to a physical or chemical vapor, corona method, or thermal evaporation deposition system and method which facilitate sequential application of coatings to an optical lens or other substrate by gravity-actuated transfer of the substrates between successive deposition chambers.

BACKGROUND OF THE INVENTION

Optical lenses of eyewear such as eyeglasses and sunglasses may include one or more optical coatings which impart a desired appearance or optical characteristic to the lenses. An optical coating includes one or multiple layers of material which are deposited on one or both sides of an optical lens and affects the manner in which the lens reflects and transmits light. Antireflective coatings and high-reflective coatings are examples of optical coatings which may be applied to an optical lens.

A common method of applying an optical coating to an optical lens includes dipping the lens in a solution which adheres to one or both surfaces of the lens upon removal of the lens from the solution and then curing the solution to form the coating. Another method of applying an optical coating to an optical lens involves applying the coating to one or both surfaces of the lens using a physical vapor deposition (PVD) process.

In some applications, it may be necessary or desirable to sequentially apply multiple layered coatings to one or both surfaces of an optical lens. For example, application of optical coatings to one or both surfaces of optical lenses for eyewear may include application of metallic, dielectric, dichroic, hydrophobic, oleophobic or super hydrophobic coatings to the lenses in a sequential manner. One challenge, which is inherent in the serial application of coatings to optical lenses, is the transfer of each lens among multiple deposition chambers in a manner which is both efficient and does not risk physical contact or contamination of the freshly-applied coatings on the lens.

Therefore, a physical vapor deposition (PVD) system which facilitates sequential application of coatings to an optical lens or other substrate by gravity-actuated transfer of the substrates between successive PVD chambers is needed.

SUMMARY OF THE INVENTION

The disclosure is generally directed to a physical vapor deposition system. An illustrative embodiment of the system includes a system housing having a housing interior, a fixture transfer assembly having a generally sloped fixture transfer rail extending through the housing interior, a plurality of processing chambers connected by the fixture transfer rail, a controller interfacing with the processing chambers and at least one fixture carrier assembly carried by the fixture transfer rail and adapted to contain one substrate. The fixture carrier assembly travels along the fixture transfer rail under influence of gravity.

BRIEF DESCRIPTION OF THE DRAWINGS

The disclosure will now be made, by way of example, with reference to the accompanying drawings, in which.

DETAILED DESCRIPTION

The following detailed description is merely exemplary in nature and is not intended to limit the described embodiments or the application and uses of the described embodiments. As used herein, the word "exemplary" or "illustrative" means "serving as an example, instance, or illustration." Any implementation described herein as "exemplary" or "illustrative" is not necessarily to be construed as preferred or advantageous over other implementations. All of the implementations described below are exemplary implementations provided to enable persons skilled in the art to practice the disclosure and are not intended to limit the scope of the appended claims. Further-more, there is no intention to be bound by any expressed or implied theory presented in the preceding technical field, background, brief summary or the following detailed description.

Figure 2:
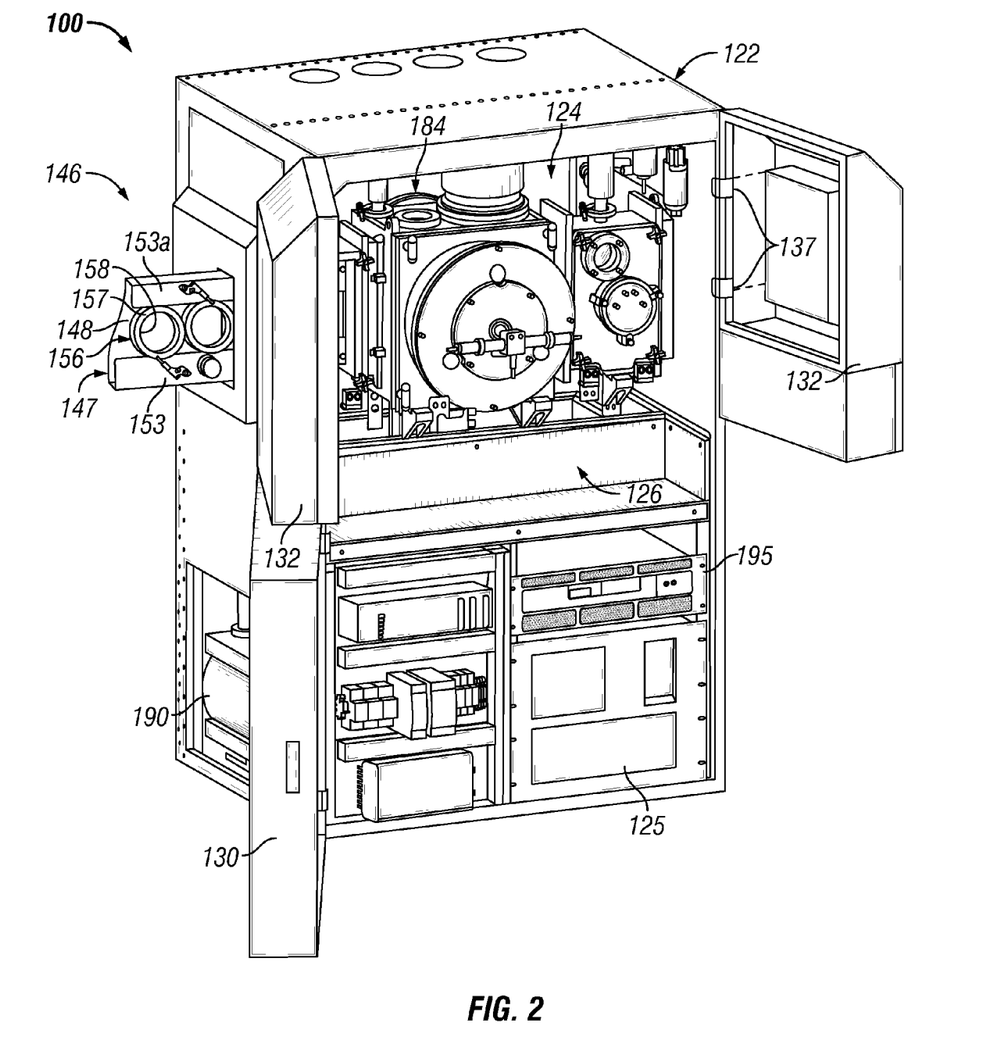
FIG. 2 is a right side front perspective view of an illustrative embodiment of the vapor deposition system, with the system housing in an open configuration.
Figure 3:
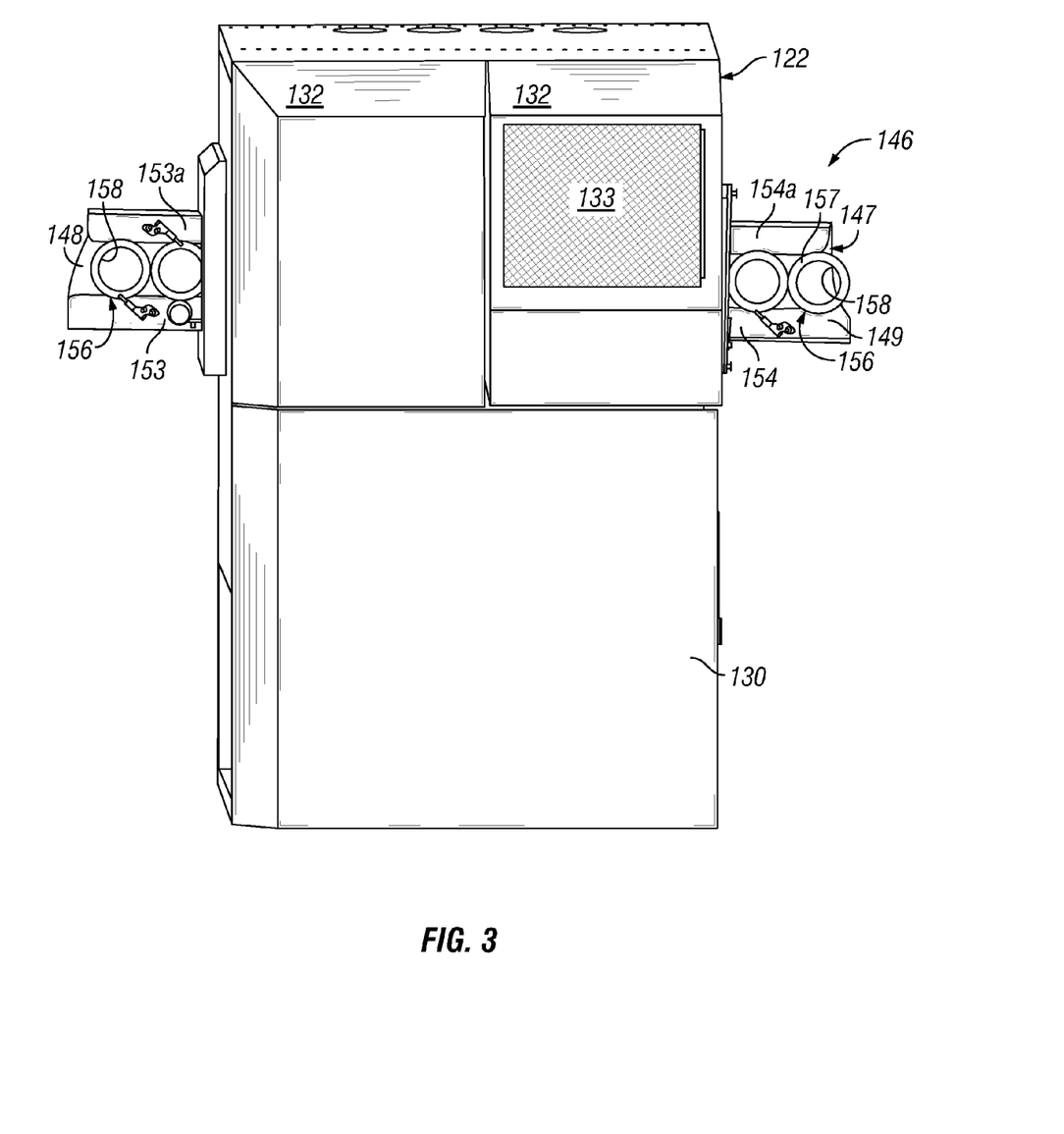
FIG. 3 is a perspective view of an illustrative embodiment of the vapor deposition system, with the system housing in a closed configuration.
Figure 4:
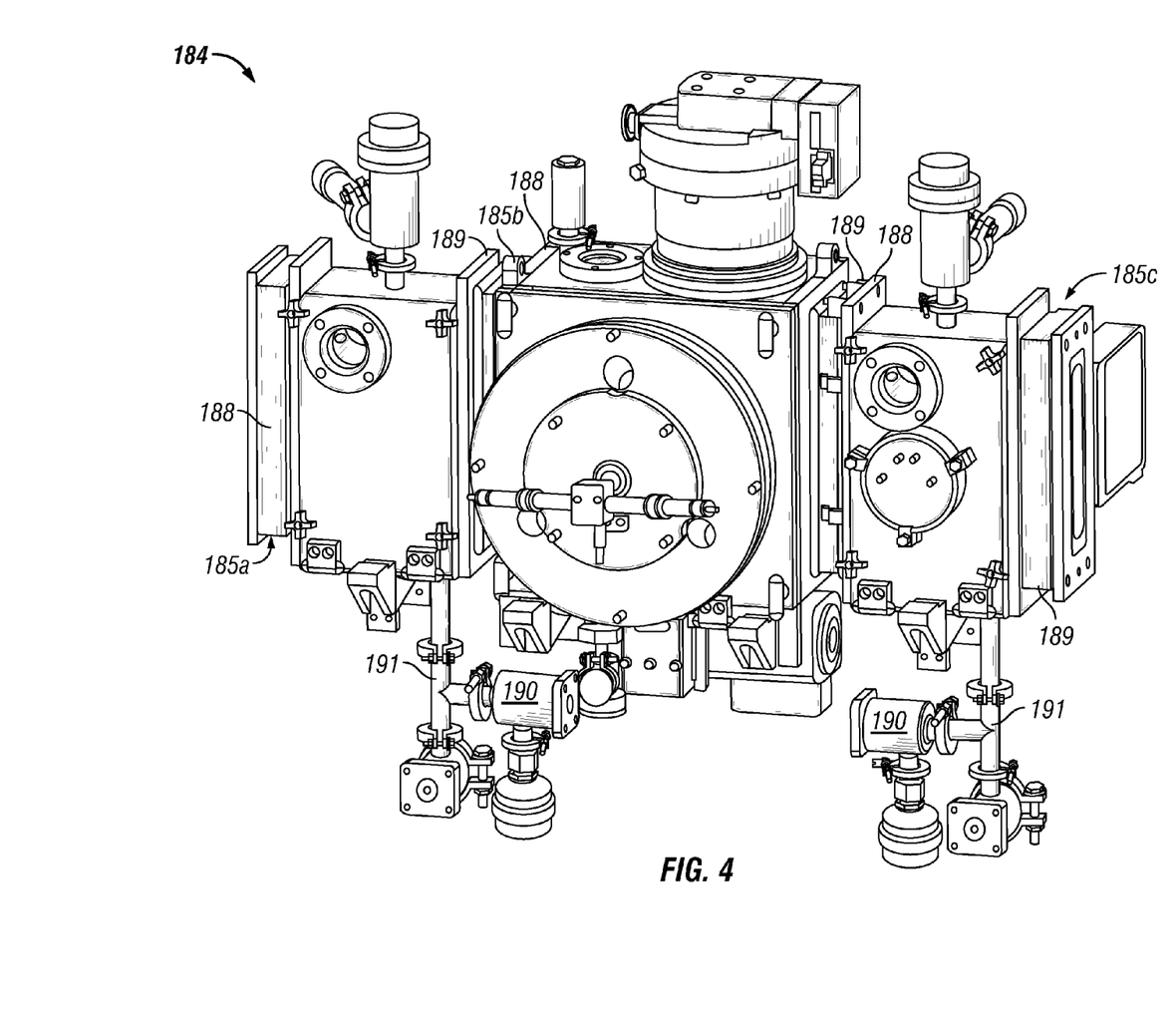
FIG. 4 is a perspective view of a film application system of an illustrative embodiment of the vapor deposition system.

Referring initially to FIGS. 1-4 of the drawings, an illustrative embodiment of the physical vapor deposition system, hereinafter system, is generally indicated by reference numeral 100. As will be hereinafter further described, the system 100 is adapted to sequentially apply one or more coatings (not illustrated) on one or both surfaces (not illustrated) of a substrate (not illustrated) using a physical vapor deposition (PVD) process. In some applications, the substrate may be an optical lens of eyewear such as eyeglasses or sunglasses, for example and without limitation. The coating(s) which is/are applied to the substrate may be hydrophobic, oleophobic or super hydrophobic coatings, for example and without limitation, which may serve as antireflective coatings, high-reflector coatings or other optical coatings known in the art. The PVD processes which are used to apply the coatings to the substrate may be sequentially carried out in a series of multiple processing chambers 185 (FIG. 4). Each substrate may be transferred from one processing chamber 185 to the next processing chamber 185 in the deposition process via gravity, as will be hereinafter further described.

The system 100 may include a system housing 122. In some embodiments, the system housing 122 may include a pair of side housing panels 123, a top housing panel 127 and a rear housing panel 128 which define a housing interior 124. The housing interior 124 may be divided into a lower subsystem compartment 125 and an upper chamber compartment 126. The subsystem compartment 125 may contain various subsystem components of the system 100 which will be hereinafter described. The chamber compartment 126 may contain a film application system 184 having multiple processing chambers 185. In operation of the system 100, which will be hereinafter described, the processing chambers 185 implement etching and physical vapor deposition functions in the processing of substrates.

Figure 1:
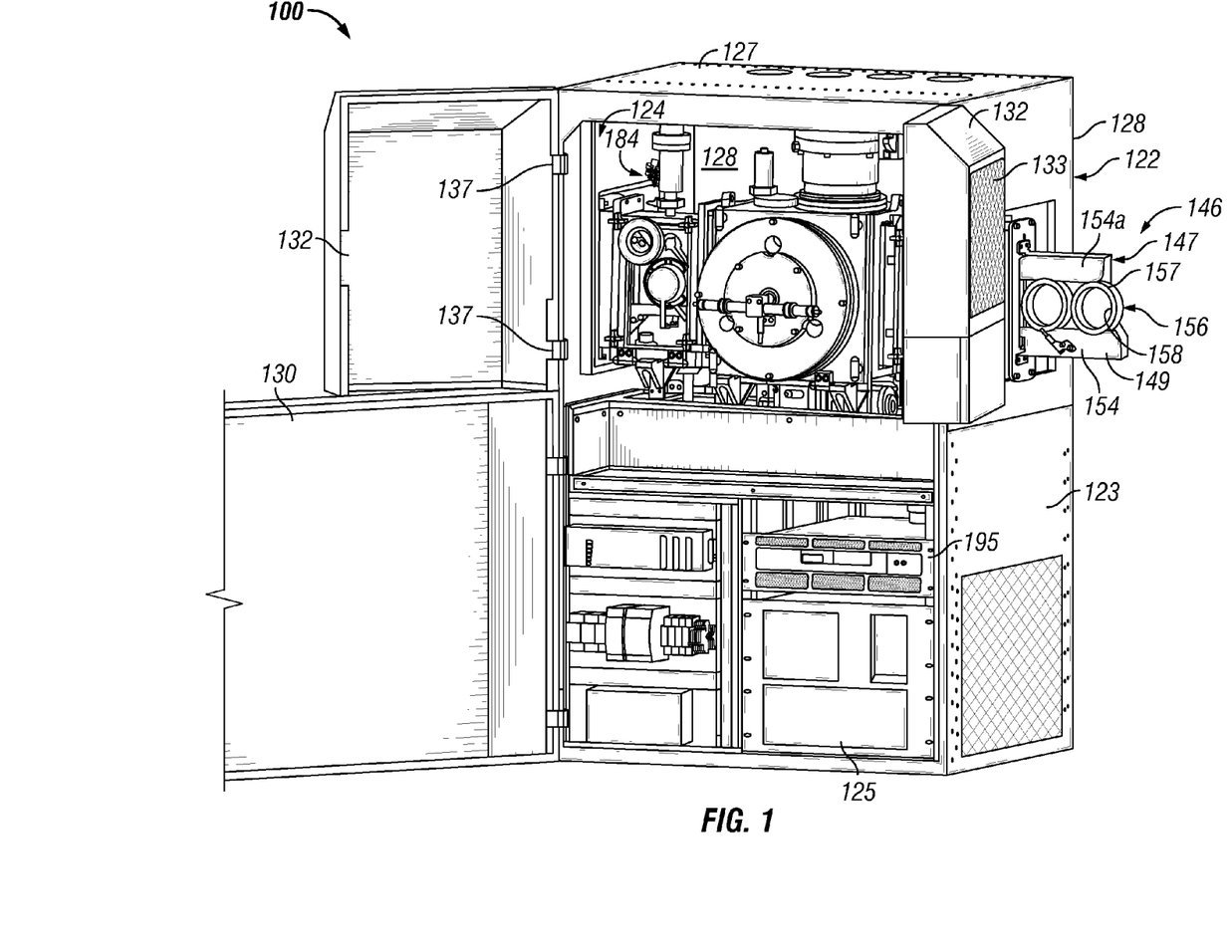
FIG. 1 is a left side front perspective view of an illustrative embodiment of the vapor deposition system, with the system housing in an open configuration.

As illustrated in FIGS. 1-4, the system housing 122 may include at least one front subsystem compartment door 130 provided on the system frame 101. In some embodiments, the system housing 122 may have multiple, adjacent front subsystem compartment doors 130. The front subsystem compartment doors 130 may be selectively opened to expose the subsystem compartment 125 at the front portion of the housing interior 124, as illustrated in FIGS. 1 and 2, or selectively closed to conceal the subsystem compartment 125 at the front portion of the housing interior 124, as illustrated in FIG. 3.

In some embodiments, the system housing 122 may further include at least one rear subsystem compartment door (not illustrated) provided on the system housing 122. The rear subsystem compartment door may be selectively opened to expose the subsystem compartment 125 at the rear portion of the housing interior 124 or selectively closed to conceal the subsystem compartment 125 at the rear portion of the housing interior 124.

The system housing 122 may include at least one front chamber compartment door 132 to selectively expose and conceal the chamber compartment 126 at the front portion of the housing interior 124. At least one of the front chamber compartment doors 132 may have at least one window 133. In some embodiments, the front chamber compartment door 132 may be pivotally attached to a side housing panel 123 of the system housing 122 via door hinges 137 (FIGS. 1 and 2). At least one door latch (not illustrated) may be provided on each front chamber compartment door 132. The door latch or latches may be adapted to selectively lock the front chamber compartment door or doors 132 in the closed position of FIG. 3 or selectively unlock the front chamber compartment door or doors 132 for opening as illustrated in FIGS. 1 and 2. In some embodiments, at least one door extension cylinder (not illustrated) may be attached to the system housing 122. A door extension piston (not illustrated) may be extendable from the door extension cylinder. The door extension piston may be attached to an interior surface of the front chamber compartment door 132. Accordingly, when the front chamber compartment door 132 is closed and the door latch (not illustrated) is latched, the door extension piston is retracted into the door extension cylinder. When the front chamber compartment door 132 is open, the door extension piston extends from the door extension cylinder and maintains the front chamber compartment door 132 in the open position.

In some embodiments, the system housing 122 may further include a rear chamber compartment door (not illustrated) to selectively expose and conceal the chamber compartment 126 at the rear portion of the housing interior 124. The rear chamber compartment door may have a design and attachment which are as were heretofore described with respect to the front chamber compartment door or doors 132.

As further illustrated in FIGS. 1-9, the system 100 may include a fixture transfer assembly 146. The fixture transfer assembly 146 may include a generally elongated fixture transfer rail 147 which extends transversely through the chamber compartment 126 of the housing interior 124 in the system housing 122. The fixture transfer rail 147 may have a fixture loading end 148 and a fixture unloading end 149. A lower loading ramp segment 153 and an upper loading ramp segment 153a, and a lower unloading ramp segment 154 and an upper unloading ramp segment 154a, of the fixture transfer rail 147 may protrude beyond the respective loading and unloading ends, respectively, of the system housing 122. The fixture transfer rail 147 may generally slope downwardly from the fixture loading end 148 to the fixture unloading end 149.

The fixture transfer rail 147 of the fixture transfer assembly 146 may be mounted in the chamber compartment 126 of the housing interior 124 according to any suitable technique which is known by those skilled in the art. In some embodiments, the fixture transfer assembly 146 may include a generally elongated chamber support member (not illustrated) which extends through the chamber compartment 126 in generally transverse relationship to the longitudinal axis of the system housing 122. The chamber support member may be attached to any structural component of the system housing 122 using welding, fasteners and/or other suitable attachment technique. The fixture transfer rail 147 may be sloped with respect to the horizontal at a slope angle of about 91.50 degrees.

As illustrated in FIGS. 1-3, the fixture transfer assembly 146 may further include at least one fixture carrier assembly 156. In some embodiments, the fixture transfer assembly 146 may include multiple fixture carrier assemblies 156, as illustrated. Each fixture carrier assembly 156 may include an annular assembly frame 157 having a frame opening 158. A fixture mount plate (not illustrated) having a fixture opening may be provided in the frame opening 158. The fixture opening is sized and configured to receive and secure a single substrate (not illustrated) typically in the conventional manner.

Figure 5:
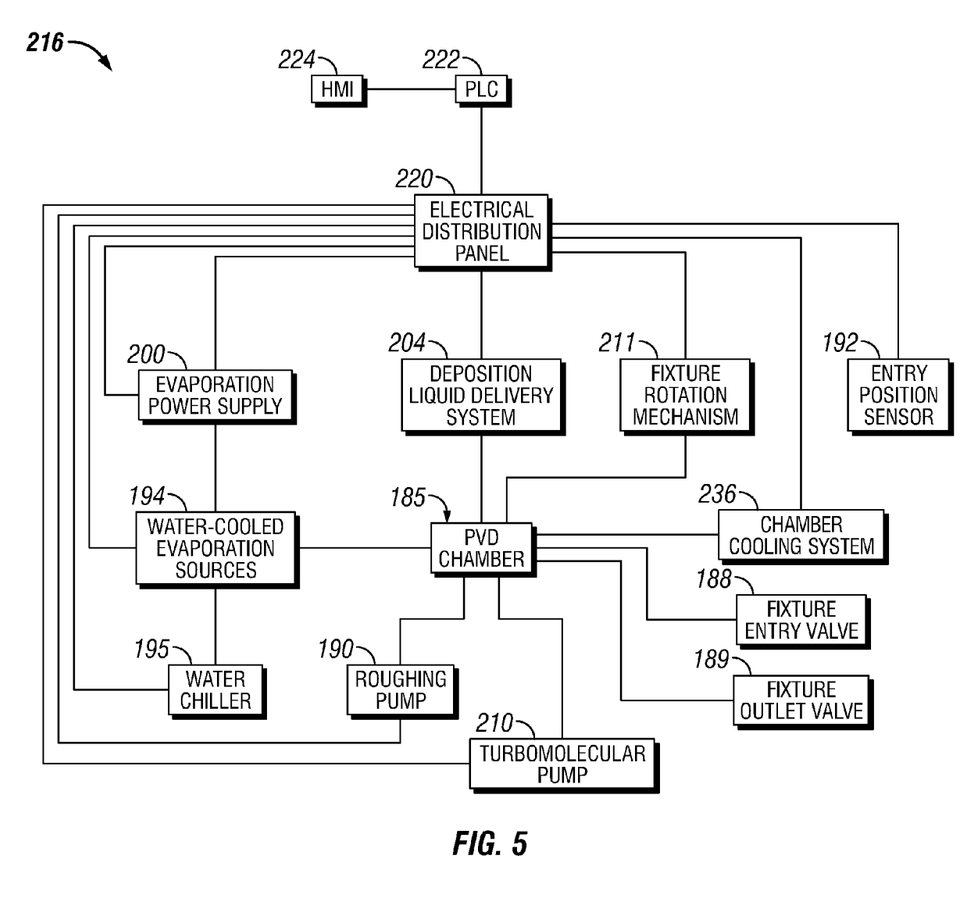
FIG. 5 is a block diagram which illustrates interconnection of the various subsystem components of the physical vapor deposition system.

As illustrated in FIGS. 1 and 2 of the drawings, a film application system 184 having multiple processing chambers 185 (FIG. 4) is provided in the chamber compartment 126 of the housing interior 124. The processing chambers 185 have physical vapor deposition capabilities according to the knowledge of those skilled in the art. At least one of the processing chambers 185 may have substrate etching capabilities. As illustrated in FIG. 5, in some embodiments, the processing chambers 185 may include a first processing chamber 185a, a second processing chamber 185b and a third processing chamber 185c which are sequentially ordered between the lower and upper loading ramp segments 153, 153a on one side and the lower and upper unloading ramp segments 154, 154a on the other side of the system housing 122. Therefore, the processing chambers 185 may assume the sloped or angled orientation of the fixture transfer rail 147.

Each processing chamber 185 is adapted to receive by gravity and contain a fixture carrier assembly 156 having a substrate (not illustrated) retained therein for processing of the substrate. As illustrated in FIG. 4, a fixture entry valve 188 may be disposed in fluid communication with each processing chamber 185 at an inlet side of the processing chamber 185. A fixture outlet valve 189 may be disposed in fluid communication with the processing chamber 185 at an outlet side of the processing chamber 185. The fixture entry valves 188 and the fixture outlet valves 189 may couple the first processing chamber 185a to the second processing chamber 185b and the second processing chamber 185b to the third processing chamber 185c with a vacuum-tight seal in the chamber compartment 126 of the housing interior 124. In operation of the system 100, which will be hereinafter further described, the fixture entry valve 188 and the fixture outlet valve 189 may facilitate sequential transfer of each of multiple fixture carrier assemblies 156 into and out of, respectively, each processing chamber 185.

As further illustrated in FIG. 4, the film applicator system 184 may include a roughing pump 190 which is disposed in fluid communication with each processing chamber 185 through a roughing pump conduit 191. Multiple water-cooled evaporation sources (not illustrated) may be provided in each processing chamber 185. A water chiller (not illustrated) may be connected to the water-cooled evaporation sources through a pair of water hoses. An evaporation power supply (not illustrated) may be electrically connected to the water-cooled evaporation sources through a pair of power cables.

At least one liquid delivery injection arm (not illustrated) may be disposed in fluid communication with each processing chamber 185. In some embodiments, a pair of front and rear liquid delivery injection arms may be disposed in fluid communication with each processing chamber 185. An arm internalization mechanism (not illustrated) may engage each liquid delivery injection arm for internalization of the liquid delivery injection arms through respective front and back side liquid delivery ports (not illustrated) into the processing chamber 185 in operation of the system 100. When in the internalized configuration, the liquid delivery injection arms may be positioned on opposite front and back sides of the fixture carrier assembly 156. A deposition liquid delivery system (not illustrated) may be disposed in fluid communication with the liquid delivery injector arms through liquid delivery lines.

A turbomolecular pump (not illustrated) may be disposed in fluid communication with each processing chamber 185. Each processing chamber 185 may include a fixture rotation mechanism (not illustrated) which facilitates rotation of the fixture carrier assembly 156 in the processing chamber 185. The fixture rotation mechanism may include a movement sensor (not illustrated) which senses movement of the fixture carrier assembly 156 in the processing chamber 185. A vacuum valve (not illustrated) may be disposed in fluid communication with the processing chamber 185 in communication with the turbomolecular pump.

It will be recognized and understood that the foregoing description of each processing chamber 185 is a general description and it will be recognized and understood that processing chambers of various design which are known by those skilled in the art may be suitable for the purpose of etching and depositing coatings on substrates using physical vapor deposition techniques in operation of the system 100. Some processing chambers 185 which are suitable for implementation of the system 100 may depart in at least some design details from the foregoing description of the processing chamber 185 which was set forth herein above with respect to FIG. 4. At least one of the processing chambers 185 may have any etching chamber design with necessary hardware which is suitable for etching and cleaning of the substrates preparatory to deposition of coatings on the substrates by operation of the processing chambers 185. Etching chamber designs are well-known by those skilled in the art; therefore, the hardware and design of the etching chamber 198 need not be set forth herein in detail. Generally, the etching chamber may include a fixture entry valve 188 and a fixture outlet valve 189 which facilitate entry and exit of individual fixture carrier assemblies 156 into and out of, respectively, the etching chamber, as was heretofore described with respect to the processing chambers 185 in FIG. 4.

Referring next to FIG. 5 of the drawings, a block diagram of a control system 216 which is suitable for implementation of the physical vapor deposition system 100 is illustrated. The control system 216 may include a programmable logic controller (PLC) 222. A human-machine interface (HMI) 224 may interface with the PLC 222. The HMI 224 may include a keyboard, mouse and/or other elements which may be used to program the PLC 222 to operate the multiple functions of the system 100. An electrical distribution panel 220 may interface with the PLC 222. The various functional components of the system 100 may be electrically connected to the electrical distribution panel 220. Accordingly, the PLC 222 may be adapted to operate the various subsystems of the system 200 through the electrical distribution panel 220.

Some of the subsystems of the system 100 may include a roughing pump 190, water-cooled evaporation sources 194, a deposition liquid delivery system 204, a fixture rotation mechanism 211, a fixture entry valve 188, a fixture outlet valve 189 and a turbomolecular pump 210, each of which is disposed inside or interfaces with the processing chamber 185. The evaporation power supply 200 may be electrically connected to the electrical distribution panel 220 and the water-cooled evaporation sources 194 in the processing chamber 185. The water chiller 195 may be electrically connected to the electrical distribution panel 220 and disposed in fluid communication with the water-cooled evaporation sources 194. In some embodiments, an entry position sensor 192 may be connected to the electrical distribution panel 220 and disposed at the entry position of the processing chamber 185 adjacent to the fixture entry valve 188. The entry position sensor 192 may be adapted to sense the fixture carrier assembly 156 at the entry position of the processing chamber 185 and enable the PLC 222 to open the fixture entry valve 188 of the processing chamber 185 for entry of the fixture carrier assembly 156 into the processing chamber 185, as will be hereinafter described. As further illustrated in FIG. 5, in some embodiments, a chamber cooling system 236 may interface with each processing chamber 185 and the electrical distribution panel 220 for the purpose of cooling the interior of the processing chamber 185.

Some of the subsystems of the system 100 may be contained in the subsystem compartment 125 (FIGS. 1 and 2) of the housing interior 124. In some embodiments, the roughing pumps 190, the water chiller 195 and the evaporation power supply 200 may be contained in the subsystem compartment 125 in the front portion of the housing interior 124. The electrical distribution panel 220 and the PLC 222 may be contained in the subsystem compartment 125 in the rear portion of the housing interior 124. The subsystems can be selectively exposed and accessed for repair, replacement and/or maintenance purposes by opening the front subsystem compartment doors 130 (FIG. 1) and the rear subsystem compartment door (not illustrated). Likewise, the PVD chambers 185 can be selectively exposed and accessed for repair, replacement and/or maintenance purposes by opening the front chamber compartment door 132 and the rear chamber compartment door (not illustrated).

In exemplary application, the system 100 is operated to apply one or multiple coatings (not illustrated) to one or both sides of a substrate (not illustrated) in a sequential manner using a physical vapor deposition (PVD) process. In some applications, the substrate may be an optical lens which will be used in the assembly of eyewear such as eyeglasses or sunglasses, for example and without limitation. For example and without limitation, in some applications, the system 100 may be operated to plasma etch the front and backsides of an optic lens; apply a mirror coating to the front of the lens; and apply an oleophobic/hydrophobic coating to the front and backside of the lens. In other applications, the substrate may be any type of substrate to which one or more coatings is to be applied using a PVD process.

A substrate is secured in each of multiple fixture carrier assemblies 156 (FIGS. 1-3). As will be hereinafter further described, each fixture carrier assembly 156 serves as a vehicle for transport of the substrate between and within the sequential processing chambers 185. Accordingly, each substrate may initially be secured in the frame opening 158 of a corresponding fixture carrier assembly 156.

As illustrated in FIGS. 2 and 3, at least one fixture carrier assembly 156 (each containing a substrate 182 held therein) is initially placed on the lower loading ramp segment 153 of the fixture transfer rail 147. In some embodiments, multiple fixture carrier assemblies 156 may be placed in series on the lower loading ramp segment 153 of the fixture transfer rail 147, as illustrated. Each fixture carrier assembly 156 may be inserted in place between the lower loading ramp segment 153 and the upper loading ramp segment 153a such that a circumferential rail groove (not illustrated) in the assembly frame 157 of the fixture carrier assembly 156 receives the lower loading ramp segment 153 and the upper loading ramp segment 153a of the fixture transfer rail 147. Therefore, each fixture carrier assembly 156 is self-standing between the lower loading ramp segment 153 and the upper loading ramp segment 153a.

Due to the angled or sloped configuration of the lower loading ramp segment 153 and the upper loading ramp segment 153a, each fixture carrier assembly 156 has a tendency to roll under influence of gravity on the fixture transfer rail 147 from the fixture loading end 148 toward the fixture unloading end 149 thereof. Accordingly, the fixture carrier assembly 156 which is first in the series of multiple fixture carrier assemblies 156 on the loading ramp segment 153 rolls to a "ready" position adjacent to a fixture entry valve 188 at the inlet of the first processing chamber 185a.

A second fixture carrier assembly 156 rolls into the space which was previously occupied by the first fixture carrier assembly 156, and the remaining fixture carrier assemblies 156 roll into the spaces previously occupied by the preceding fixture carrier assemblies 156, respectively.

The system 100 is initialized and enters a standby condition as the PLC 222 (FIG. 5) is turned on. The operational parameters (temperature, pressure, etc.) for the etching process which is to be carried out and for each of the deposition processes which are to be sequentially carried out in the processing chambers 185 may be programmed into the PLC 222 (FIG. 5) through the HMI 224. An entry position sensor (not illustrated) at the "ready" position adjacent to the fixture entry valve 188 of the first processing chamber 185a senses the location of the first fixture carrier assembly 156 at the "ready" position and transmits a signal to the PLC 222. In response, the PLC 222 opens the fixture entry valve 188 of the first processing chamber 185a and the first fixture carrier assembly 156 rolls into the first processing chamber 185a. The PLC 222 then closes the fixture entry valve 188 of the first processing chamber 185a and establishes the programmed pressure in the first processing chamber 185a. The next fixture carrier assembly 156 in line on the unloading ramp segment 154 rolls on the fixture transfer rail 147 under the influence of gravity into the "ready" position next to the fixture entry valve 188 of the first processing chamber 185.

After the PLC 222 establishes the etching temperature, pressure and other operational parameters which were preprogrammed into the PLC 222, the first processing chamber 185a, under control by the PLC 222, may operate to etch and clean both surfaces of each substrate which is held in the first fixture carrier assembly 156. After etching and cleaning of the substrates in the first fixture carrier assembly 156 is completed, the PLC 222 opens a fixture outlet valve 189 of the first processing chamber 185 and the first fixture carrier assembly 156 rolls from the first processing chamber 185 into the entry position of the second processing chamber 185b. The entry position sensor 192 (FIG. 5) senses that the first fixture carrier assembly 156 is at the entry position of the second processing chamber 185b and transmits a signal to the PLC 222 indicating the entry position of the first fixture carrier assembly 156. In response, the PLC 222 vents the first processing chamber 185a to atmosphere and then opens the fixture entry valve 188 of the second processing chamber 185b. Simultaneously, the front and back side liquid delivery ports (not illustrated) of the second processing chamber 185b are opened and the front and rear liquid delivery injector arms (not illustrated), under actuation by the arm internalization mechanisms (not illustrated), descend into the second processing chamber 185b. The first fixture carrier assembly 156 rolls into place in the second processing chamber 185b. The PLC 222 then closes the fixture entry valve 188. The PLC 222, responsive to input from the entry sensor (not illustrated) at the "ready" position of the first processing chamber 185a, opens the fixture entry valve (not illustrated) of the first processing chamber 185a and the fixture carrier assembly 156 which was next in line behind the first fixture carrier assembly 156 rolls on the fixture transfer rail 147 into the first processing chamber 185a.

The deposition liquid (not illustrated) which will form the coatings on one or both surfaces of each substrate in the first fixture carrier assembly 156 is dispensed from the deposition liquid delivery system 204 (FIG. 5) through the respective liquid delivery lines (not illustrated) to the liquid delivery injector arms (not illustrated). The liquid delivery injector arms dispense the deposition liquid into the water-cooled evaporation sources 194 (FIG. 5) in the second processing chamber 185*b*. Once the deposition liquid is fully dispensed into the evaporation sources 194, the liquid delivery injector arms are retracted from the second processing chamber 185*b* and the liquid delivery ports (not illustrated) are closed. Next, the fixture rotation mechanism 211 (FIG. 5) may rotate the first fixture carrier assembly 156 in the second processing chamber 185*b* and the PLC 222 pulls vacuum on the second processing chamber 185*b* via the roughing pump 190 and the turbomolecular pump. Once the correct level of vacuum pressure in the second processing chamber 185*b* has been achieved, the deposition liquid in the evaporation sources 194 is evaporated into the second processing chamber 185*b*, coating the substrate in the first fixture carrier assembly 156. After it determines that a predetermined period of time has elapsed to ensure thorough coating of the substrates, the PLC 222 vents the second processing chamber 185*b* to atmosphere. The PLC 222 then opens the fixture outlet valve 189 of the second processing chamber 185*b* such that the first fixture carrier assembly 156 rolls under influence of gravity the second processing chamber 185*b* to the fixture entry position of the third processing chamber 185*c*. The same PVD and transfer process is then carried out on the substrates of the first fixture carrier assembly 156 in the third processing chamber 185*d* until the desired coatings have been sequentially applied to the surfaces of each substrate. As the PVD process is carried out in the second processing chamber 185*b*, the substrates held in the fixture carrier assembly 156 which was next in line behind the first fixture carrier assembly 156 may be etched in the first processing chamber 185*a*. The substrates in that next-in-line fixture carrier assembly 156 may then be subjected to the PVD processes in the second processing chamber 185*b* and the third processing chamber 185*c* in the same manner as the substrates in the first fixture carrier assembly 156.

After the PVD processes in the third processing chamber 185*c* are completed, the fixture carrier assemblies 156 sequentially roll from the third processing chamber 185*c* onto the unloading ramp segment 154 of the fixture transfer rail 147. The fixture carrier assemblies 156 are removed from the unloading ramp segment 154 and the substrates are removed from the frame openings 158 in the fixture carrier assemblies 156 for further processing. Between uses of the system 100, the PLC 222 may periodically operate the chamber cooling system 236 (FIG. 5) to clean the interior of each processing chamber 185 as deemed necessary.

It will be appreciated by those skilled in the art that the physical vapor deposition system 100 is capable of processing substrates in multiple fixture carrier assemblies 156 at the same time by simultaneous operation of the processing chambers 185. This expedient facilitates high-speed, low-volume and high-throughput production of thin film-coated substrates using physical vapor deposition processes. Moreover, transfer of the fixture carrier assemblies 156 between the processing chambers 185 by gravity eliminates the need for mechanical structure and related power supply which would otherwise be required for the transfer operation. The system 100 may be designed such that the chamber functions and capabilities are flexible and can be adapted for various types of physical vapor deposition applications on different types of substrates. Examples include but are not limited to ophthalmic mirror coatings, ophthalmic anti-reflective coatings, protective coatings, cosmetic coatings, compact disc manufacturing and medical device manufacturing. The construction methods and materials for the system 100 may be tailored according to the particular thin films which are to be applied to the substrates. The system 100 may be constructed in any of various sizes depending on the desired application. Various alternative designs for the subsystems, assemblies and components may be used in various embodiments of the system 100. The system 100 may be fabricated using a variety of fabrication techniques including but not limited to welding, brazing, connectors, terminal blocks, screws, bolts, nuts and clamps.

It will be further appreciated by those skilled in the art that each processing chamber 185 may contain multiple water-cooled evaporation sources 194 (FIG. 5) to enhance the flexibility of the physical vapor deposition system 100. Thus, multiple types of physical vapor deposition by evaporation processes can be carried out in each processing chamber 185. The system housing 122 may be fabricated with a small footprint to facilitate ease and space efficiency in placement of the physical vapor deposition system 100 in retail locations.

Various structural provisions instead of or in addition to those which were heretofore described with respect to the drawings may be made for the functioning and distribution of the vacuum subsystem, pneumatic subsystem, electrical subsystem and/or any other subsystems or components which may be deemed necessary for operation of the processing chambers 185 or any other operational component or subsystem of the system 100. For example and without limitation, vacuum system conduits (not illustrated) may be routed throughout the housing interior 124 to provide connection between the roughing pumps 190, turbomolecular pumps and/or other pumps and the processing chambers 185. Pneumatic system conduits (not illustrated) may provide connection between vacuum subsystem components or pneumatic subsystem components and the processing chambers 185. Pneumatic system ports (not illustrated) may be provided in the fixture transfer rail 147 and/or other structural components of the system 100 for functioning of the pneumatic subsystem. Other structural provisions may include whichever supports, wiring and plumbing may be necessary to interconnect all components and subsystems.

The film applicator system 184 (FIG. 17) of the system 100 may be designed as a stand-alone unit, as part of an in-line physical vapor deposition system or as part of a larger, more complex system. The film applicator system 184 can coat one side or two sides of a substrate and a two-sided coating applied to the substrate may be performed individually or simultaneously at high speeds and high throughput. The film applicator system 184 may be operated manually, semi-automatically or fully automatically via a computer or the PLC 222 and HMI 224 (FIG. 5).

The fixture carrier assemblies 156 may be constructed of various materials depending on the particular application. The fixture carrier assemblies 156 may be constructed for single-side application and may be fabricated in various sizes. Alternative methods of holding the substrate in the frame opening 158 of each fixture carrier assembly 156 may be used. Moreover, the design of each fixture carrier assembly 156, as well as each processing chamber 185 as described and illustrated herein, may facilitate uniform coating of either or both surfaces of each substrate depending on the desired application.

Figure 6:
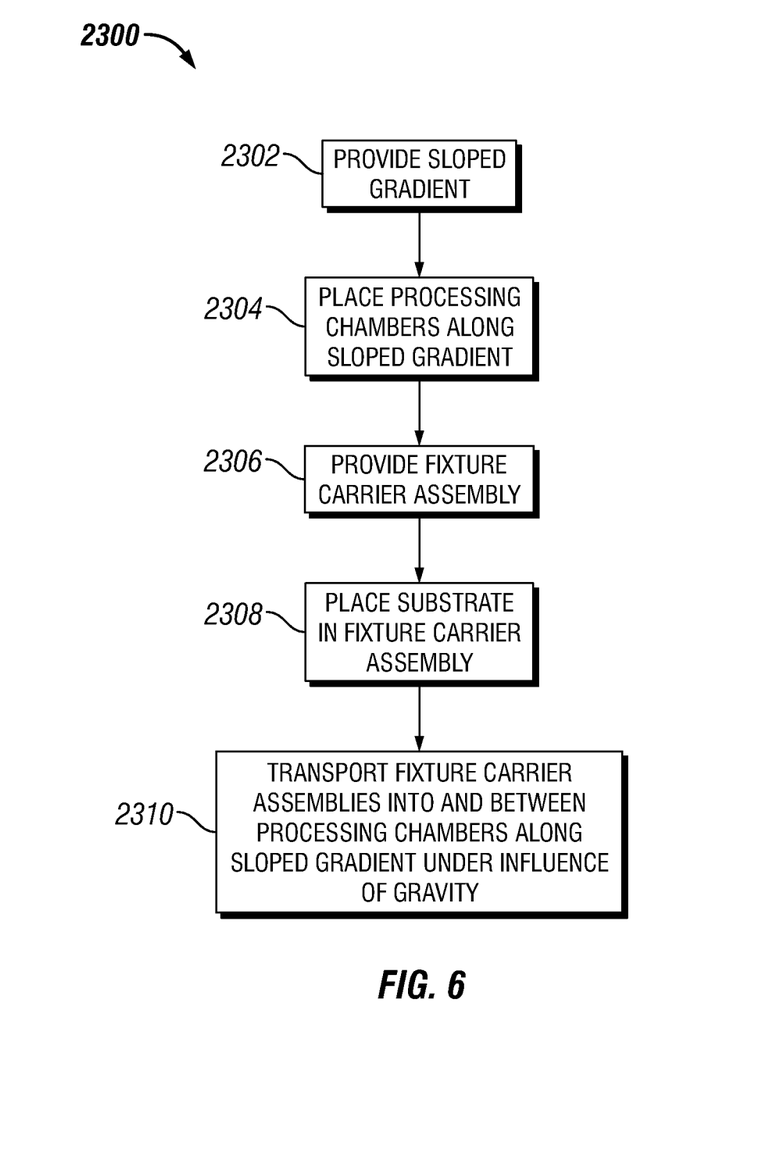
FIG. 6 is a flow diagram of an illustrative embodiment of a physical vapor deposition method.

Referring next to FIG. 6 of the drawings, a flow diagram 2300 of an illustrative embodiment of a physical vapor deposition method is illustrated. In block 2302, a sloped gradient is provided. In block 2304, processing chambers are placed along the sloped gradient. In some applications, the processing chambers may include an etching chamber and at least one physical vapor deposition (PVD) chamber. In some embodiments, the processing chambers may include an etching chamber and multiple sequentially-ordered PVD chambers. In block 2306, at least one fixture carrier assembly is provided. In block 2308, a substrate is placed in the fixture carrier assembly. In block 2310, the fixture carrier assemblies are transported into and between the processing chambers along the sloped gradient under the influence of gravity. The design of each PVD chamber and each fixture carrier assembly may facilitate uniform deposition of one or more coatings on either or both surfaces of each substrate.

While various illustrative embodiments of the disclosure have been described above, it will be recognized and understood that various modifications can be made in the disclosure and the appended claims are intended to cover all such modifications which may fall within the spirit and scope of the embodiments of the disclosure.

What is claimed is:

1. A deposition method, comprising:
providing a sloped gradient;
providing a plurality of processing chambers along the sloped gradient;
providing at least one fixture carrier assembly, the at least one fixture carrier assembly including an annular assembly frame having a frame opening, a fixture mount plate in the frame opening, at least one fixture opening in the fixture mount plate, at least one substrate fixture in the at least one fixture opening and the at least one substrate fixture having at least one lens support arm and a plurality of pivoting substrate contact blades, at least one of the plurality of pivoting contact blades pivotally carried by the at least one lens support arm;
placing at least one substrate in the at least one substrate fixture;
pivoting the at least one lens support arm with respect to the at least one substrate fixture and pivoting the plurality of pivoting substrate contact blades into contact with a substrate edge of the at least one substrate, the plurality of substrate contact blades limited to contact of the substrate at the substrate edge; and
transporting the at least one fixture carrier assembly into and between the processing chambers along the sloped gradient under influence of gravity.

2. The deposition method of claim 1 wherein providing a plurality of processing chambers along the sloped gradient comprises providing a plurality of sequentially-ordered deposition chambers along the sloped gradient.

3. The deposition method of claim 1 wherein providing a plurality of processing chambers along the sloped gradient comprises providing at least one etching chamber along the sloped gradient.

4. The deposition method of claim 1 wherein placing at least one substrate in the frame opening of the at least one fixture carrier assembly comprises placing at least one optical lens of eyewear in the frame opening of the at least one fixture carrier assembly.

5. The deposition method of claim 1 wherein providing a sloped gradient comprises providing a generally elongated fixture transfer rail, and wherein transporting the at least one fixture carrier assembly into and between the processing chambers along the sloped gradient under influence of gravity comprises placing the at least one fixture carrier assembly on the fixture transfer rail and rolling the at least one fixture carrier assembly along the fixture transfer rail.

6. The deposition method of claim 5 wherein providing a generally elongated fixture transfer rail comprises providing a generally elongated fixture transfer rail having a fixture loading end and a fixture unloading end, and wherein transporting the at least one fixture carrier assembly into and between the processing chambers along the sloped gradient under influence of gravity comprises placing the at least one fixture carrier assembly on the fixture loading end and removing the at least one fixture carrier assembly from the fixture unloading end.

7. The deposition method of claim 5 wherein placing the at least one fixture carrier assembly on the fixture transfer rail comprises placing the at least one fixture carrier assembly on the fixture transfer rail such that a circumferential rail groove in the assembly frame of the fixture carrier assembly receives the fixture transfer rail.

8. The deposition method of claim 5 wherein providing a generally elongated fixture transfer rail comprises providing a generally elongated fixture transfer rail having a lower loading ramp segment and an upper loading ramp segment, and placing the at least one fixture carrier assembly on the fixture transfer rail comprises placing the at least one fixture carrier assembly between the lower loading ramp segment and the upper loading ramp segment.

9. A deposition method, comprising:
providing a sloped gradient;
providing a plurality of processing chambers along the sloped gradient;
providing at least one fixture carrier assembly, the at least one fixture carrier assembly including an annular assembly frame having a frame opening and a fixture mount plate having a fixture opening in the frame opening, at least one substrate fixture in the fixture opening and the at least one substrate fixture having a fixture frame with a fixture frame opening sized and configured to receive and secure a single substrate, at least one lens support arm and a plurality of pivoting substrate contact blades pivotally carried by the fixture frame, at least one of the plurality of pivoting contact blades pivotally carried by the at least one lens support arm;
placing the substrate in the fixture opening of the at least one fixture carrier assembly;
pivoting the at least one lens support arm with respect to the at least one substrate fixture and pivoting the plurality of pivoting substrate contact blades into contact with a substrate edge of the at least one substrate, the plurality of substrate contact blades limited to contact of the substrate at the substrate edge; and
transporting the at least one fixture carrier assembly into and between the processing chambers along the sloped gradient under influence of gravity.

10. The deposition method of claim 9 wherein providing a plurality of processing chambers along the sloped gradient comprises providing a plurality of sequentially-ordered deposition chambers along the sloped gradient.

11. The deposition method of claim 9 wherein providing a plurality of processing chambers along the sloped gradient comprises providing at least one etching chamber along the sloped gradient.

12. The deposition method of claim 9 wherein placing a substrate in the fixture opening of the at least one fixture carrier assembly comprises placing an optical lens of eyewear in the fixture opening of the at least one fixture carrier assembly.

13. The deposition method of claim 9 wherein providing a sloped gradient comprises providing a generally elongated fixture transfer rail, and wherein transporting the at least one fixture carrier assembly into and between the processing chambers along the sloped gradient under influence of gravity comprises placing the at least one fixture carrier assembly on the fixture transfer rail and rolling the at least one fixture carrier assembly along the fixture transfer rail.

14. The deposition method of claim 13 wherein providing a generally elongated fixture transfer rail comprises providing a generally elongated fixture transfer rail having a fixture loading end and a fixture unloading end, and wherein transporting the at least one fixture carrier assembly into and between the processing chambers along the sloped gradient under influence of gravity comprises placing the at least one fixture carrier assembly on the fixture loading end and removing the at least one fixture carrier assembly from the fixture unloading end.

15. The deposition method of claim 14 wherein placing the at least one fixture carrier assembly on the fixture transfer rail comprises placing the at least one fixture carrier assembly on the fixture transfer rail such that a circumferential rail groove in the assembly frame of the fixture carrier assembly receives the fixture transfer rail.

16. The deposition method of claim 14 wherein providing a generally elongated fixture transfer rail comprises providing a generally elongated fixture transfer rail having a lower loading ramp segment and an upper loading ramp segment, and placing the at least one fixture carrier assembly on the fixture transfer rail comprises placing the at least one fixture carrier assembly between the lower loading ramp segment and the upper loading ramp segment.

17. A deposition method, comprising:
providing a sloped gradient including a generally elongated fixture transfer rail having a fixture loading end with a lower loading ramp segment and an upper loading ramp segment and a fixture unloading end with a lower unloading ramp segment and an upper unloading ramp segment;
providing a plurality of processing chambers along the fixture transfer rail of the sloped gradient;
providing at least one fixture carrier assembly, the at least one fixture carrier assembly including an annular assembly frame having a frame opening and a fixture mount plate having a fixture opening in the frame opening, a circumferential rail groove in the assembly frame of the fixture carrier assembly, at least one substrate fixture in the fixture opening and the at least one substrate fixture having a fixture frame with a fixture frame opening sized and configured to receive and secure a single substrate, at least one lens support arm and a plurality of pivoting substrate contact blades pivotally carried by the fixture frame, at least one of the plurality of pivoting contact blades pivotally carried by the at least one lens support arm, the plurality of pivoting substrate contact blades disposed in spaced-apart relationship to each other around the fixture frame opening;
placing the substrate in the fixture opening of the at least one fixture carrier assembly;
pivoting the at least one lens support arm with respect to the at least one substrate fixture and pivoting the plurality of pivoting substrate contact blades into contact with a substrate edge of the at least one substrate, the substrate contact blades limited to contact of the substrate at the substrate edge;
placing the at least one fixture carrier assembly on the fixture transfer rail such that the circumferential rail groove in the assembly frame of the fixture carrier assembly receives the lower loading ramp segment and the upper loading ramp segment of the fixture transfer rail and the at least one fixture carrier assembly is self-standing between the lower loading ramp segment and the upper loading ramp segment; and
transporting the at least one fixture carrier assembly into and between the processing chambers along the fixture transfer rail of the sloped gradient under influence of gravity.

18. The deposition method of claim 17 wherein providing a plurality of processing chambers along the fixture transfer rail comprises providing a plurality of sequentially-ordered deposition chambers along the fixture transfer rail.

19. The deposition method of claim 17 wherein providing a plurality of processing chambers along the fixture transfer rail comprises providing at least one etching chamber along the fixture transfer rail.

20. The deposition method of claim 17 wherein placing a substrate in the fixture opening of the at least one fixture carrier assembly comprises placing an optical lens of eyewear in the fixture opening of the at least one fixture carrier assembly.

* * * * *